US005479139A

United States Patent [19]

Koscica et al.

[11] Patent Number: 5,479,139

[45] Date of Patent: Dec. 26, 1995

[54] SYSTEM AND METHOD FOR CALIBRATING A FERROELECTRIC PHASE SHIFTER

[75] Inventors: Thomas E. Koscica, Clark; Richard W. Babbitt, Fair Haven; William C. Drach, Tinton Falls, all of N.J.

[73] Assignee: The United States of America as represented by the Secretary of the Army, Washington, D.C.

[21] Appl. No.: 423,486

[22] Filed: Apr. 19, 1995

[51] Int. Cl.$^6$ .................... H03H 7/18

[52] U.S. Cl. .................... 333/18; 333/161

[58] Field of Search .................... 333/17.1, 18, 156, 333/161

[56] References Cited

U.S. PATENT DOCUMENTS

| | | | |
|---|---|---|---|
| 3,355,681 | 11/1967 | Beurrier et al. | 333/18 X |
| 5,208,213 | 5/1993 | Ruby | 333/18 X |
| 5,212,463 | 5/1993 | Babbitt et al. | 333/161 |
| 5,307,033 | 4/1994 | Koscica et al. | 333/161 |

*Primary Examiner*—Paul Gensler
*Attorney, Agent, or Firm*—Michael Zelenka; James A. DiGiorgio

[57] ABSTRACT

A ferroelectric phase shifter for shifting the phase of a radio frequency (RF) signal. The phase shifter includes a conductor line, a ground plane and a ferroelectric element between the conductor line and the ground plane to form a microstrip circuit through which the RF signal propagates. The ferroelectric element has a dielectric constant that can be varied as a function of a DC voltage applied to the ferroelectric element wherein the speed of the RF signal propagating through the ferroelectric element is a function of the dielectric constant. The phase shifter further includes a DC voltage source connected across the conductor line and the ground plane. The DC voltage source applies a variable DC voltage to the ferroelectric element in response to a control signal thereby to vary the dielectric constant of the ferroelectric element. The phase shifter further includes a controller circuit operating at a test frequency having a synchronous detector for detecting changes in the dielectric constant of the ferroelectric element. The controller circuit provides the control signal to the DC voltage source to vary the applied DC voltage as a function of the detected changes. In this manner, changes in the dielectric constant over time are compensated for and the phase shift is maintained substantially constant.

16 Claims, 4 Drawing Sheets

SYSTEM AND METHOD FOR CALIBRATING A FERROELECTRIC PHASE SHIFTER

GOVERNMENT INTEREST

The invention described herein may be manufactured, used, and licensed by or for the Government of the United States of America without the payment to us of any royalty thereon.

FIELD OF THE INVENTION

This invention relates in general to signal processing and, particularly, to an improved system and method for calibrating ferroelectric phase shifters used in microwave applications.

BACKGROUND OF THE INVENTION

Ferroelectric phase shifters are typically used to phase shift radio frequency signals for use in, for example, steering microwave signals in electronic scanning arrays. Commonly assigned U.S. Pat. No. 5,212,463, the entire disclosure of which is incorporated herein by reference in its entirety, discloses a planar ferroelectric phase shifter in accordance with the present invention. The phase shifter disclosed in U.S. Pat. No. 5,212,463 is an inexpensive, easily manufacturable alternative to ferrite phase shifters for steering microwave radar beams and is compatible with commonly-used microwave transmission media.

In general, the ferroelectric phase shifter is a microstrip circuit having a ferroelectric material interposed between a conductor line and a ground plane. The conductor line typically includes an impedance transformer for matching the impedances at the material interface between the non-ferroelectric and ferroelectric materials. In this manner, the impedance transformer reduces signal reflections. A microwave signal input to the phase shifter emerges from the transformer and travels through the ferroelectric material between the conductor line and the ground plane.

As is known in the art, the dielectric constant of the ferroelectric material affects the speed of a microwave signal propagating through the phase shifter and, thus, causes a phase shift. The dielectric constant of the ferroelectric material, however, can be varied by a DC voltage applied across the ferroelectric between the conductor line and the ground plane. Typically, DC voltage is supplied by an outside DC power supply through a high-impedance, low pass filter preventing microwave energy from entering the DC supply. An inductive coil or other appropriate circuit may serve this role. A DC blocking circuit is typically used to confine DC voltage to a select region of interest only in the microstrip circuit. Conventional DC blocking circuits include coupled lines and chip capacitors. U.S. Pat. No. 5,212,463, as well as the article "High Voltage DC Block for Microstrip Ground Planes", Electronics Letters, Aug. 2, 1990, Vol. 26, No. 16., by Thomas Koscica, disclose high-voltage DC bias blocking circuits in the ground plane of a microstrip circuit.

In practice, the dielectric constant of a ferroelectric material will change over time due to several factors including temperature, humidity, aging of the material and hysteresis. Therefore, it is important to know the dielectric constant of a phase shifter's ferroelectric material during operation to ensure effective operation of the phase shifter.

A disadvantage associated with presently available ferroelectric phase shifters is that they can only be calibrated during the fabrication process. The degree to which temperature, humidity, aging, hysteresis and the like cause the value of the dielectric constant to vary over time depends on the particular material. Ferroelectric materials are available which demonstrate minimal dielectric constant variations as a result of these factors. However, such materials have the undesirable properties of low phase change with voltage which is the main parameter of interest.

For these reasons, a phase shifter capable of realtime calibration is desired to relax the need for such high material specifications during the fabrication process. Likewise, a ferroelectric phase shifter capable of performing a self-test to indicate valid phase shifter operation is desired.

SUMMARY OF THE INVENTION

Accordingly, an object of the present invention is to provide an improved system and method for calibrating a ferroelectric phase shifter in real-time to compensate for variations in the dielectric constant of the phase shifter's ferroelectric element and, thus, decrease phase errors and improve the effective performance of the phase shifter.

Another object of the present invention is to provide such an improved system and method which permits less expensive, higher material parameter drifting ferroelectric materials to be used in phase shifters without sacrificing the effective performance of the phase shifter.

Yet another object of the present invention is to provide such an improved system and method for monitoring the dielectric constant of the phase shifter's ferroelectric element, for detecting changes in the dielectric constant, and for automatically adjusting bias voltage to maintain the dielectric constant at a desired static value.

These and other objects of the invention are achieved by a ferroelectric phase shifter according to the present invention. The phase shifter includes a conductor line, a ground plane and a ferroelectric element between the conductor line and the ground plane to form a microstrip circuit through which a radio frequency (RF) signal propagates for phase shifting. The ferroelectric element has a dielectric constant that can be varied as a function of a DC voltage applied to the ferroelectric element wherein the speed of the RF signal propagating through the ferroelectric element is a function of the dielectric constant. The ferroelectric phase shifter further includes a DC voltage source connected across the conductor line and the ground plane. The DC voltage source applies a variable DC voltage to the ferroelectric element in response to a control signal thereby to vary the dielectric constant of the ferroelectric element. According to the invention, a controller circuit detects changes in the dielectric constant of the ferroelectric element and provides the control signal to the DC voltage source to vary the applied DC voltage as a function of the detected changes. In this manner, changes in the dielectric constant over time are compensated for and the phase shift is maintained substantially constant at a desired value.

In another form, the invention is directed to a method of controlling a ferroelectric phase shifter. The phase shifter includes a conductor line, a ground plane and a ferroelectric element between the conductor line and the ground plane. The ferroelectric element has a dielectric constant that can be varied as a function of a DC voltage applied to the ferroelectric element wherein the speed of an RF signal propagating through the ferroelectric element is a function of the dielectric constant. The method includes the steps of connecting a DC voltage source across the conductor line and the ground plane for applying a variable DC voltage to the ferroelectric element and detecting changes in the dielectric constant of the ferroelectric element. The method further comprises the steps of providing a control signal to the DC voltage source as a function of the detected changes and varying the applied voltage of the DC voltage source in response to the control signal. By varying the applied voltage, the present invention varies the dielectric constant of the ferroelectric element. In this manner, changes in the dielectric constant over time are compensated for and the phase shift is maintained substantially constant at a desired value.

Alternatively, the invention may comprise various other systems and methods. Other objects and features will be in part apparent and in part pointed out hereinafter.

BRIEF DESCRIPTION OF THE DRAWINGS

These and other objects, features, and details of the invention will become apparent in light of the ensuing detailed disclosure, and particularly in light of the drawings wherein.

Some of the elements of the Figures have not been drawn to scale for purposes of illustrating the invention. Moreover, corresponding reference characters indicate corresponding parts throughout the drawings.

DETAILED DESCRIPTION

Figure 1:
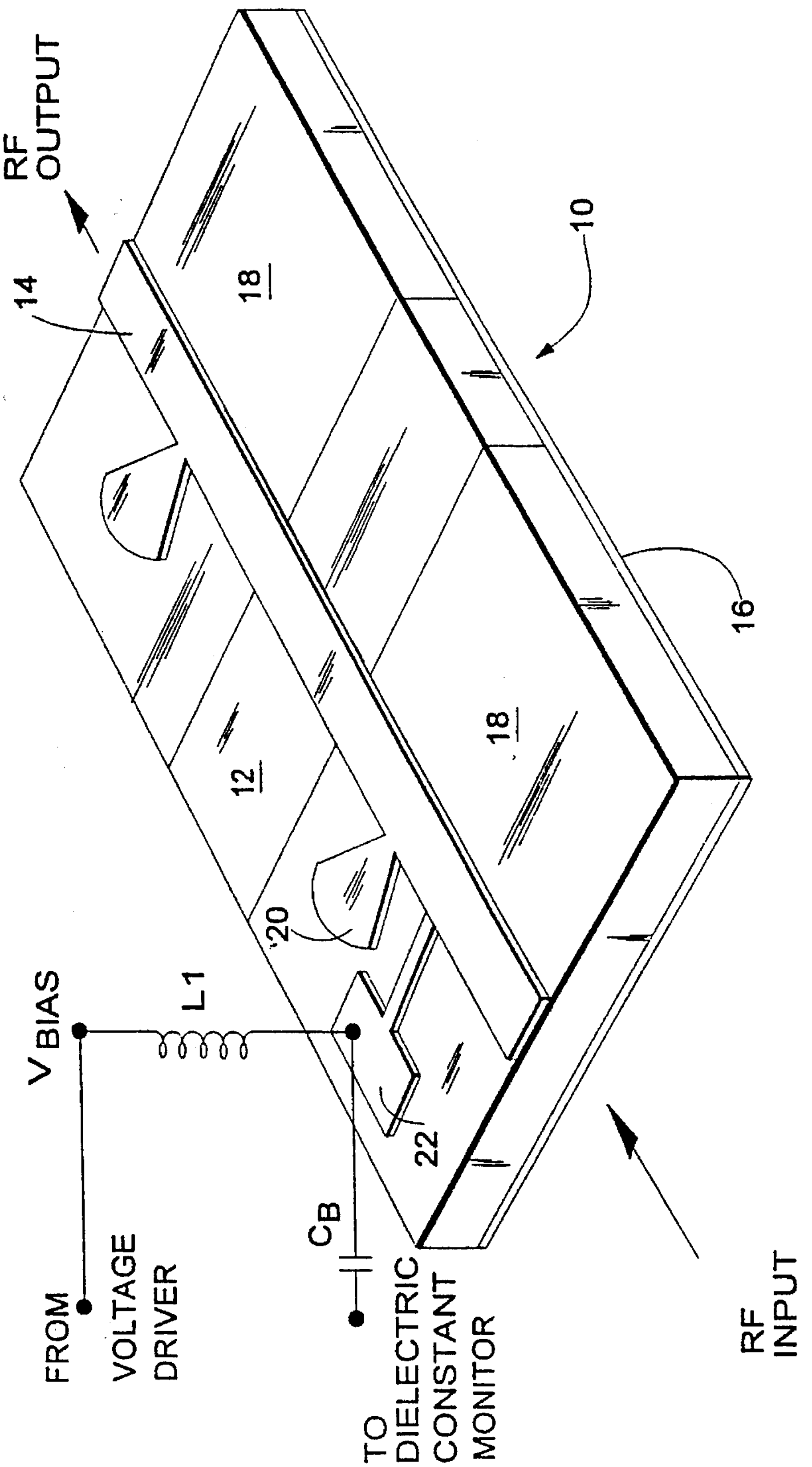
FIG. 1 is a perspective view of a ferroelectric phase shifter according to one preferred embodiment of the present invention.

FIG. 1 shows a ferroelectric phase shifter 10 according to one preferred embodiment of the present invention. The phase shifter 10 shown is of a planar electric microstrip construction and includes a high dielectric constant ferroelectric element 12. A radio frequency (RF) signal, typically of microwave frequency, is input to phase shifter 10 in order to shift its phase. As is known, phase shifter 10 includes a conductor line 14 and a ground plane 16. The ferroelectric element 12 is interposed between the conductor line 14 and the ground plane 16 to form a microstrip circuit through which the RF signal propagates. In this embodiment, a low-loss, low dielectric constant (e.g., $\epsilon<20$) material 18 is also interposed between conductor line 14 and ground plane 16 and on either side of ferroelectric element 12.

In a preferred embodiment, conductor line 14 includes at least one matching transformer 20. The RF signal first travels through the transformer 20 before entering ferroelectric element 12. As a result, the signal enters the relatively low impedance ferroelectric element 12 with minimum signal reflections. As an example, transformer 20 is approximately $\lambda/4$ in length and matches the RF signal into ferroelectric element 12 when a 50 Ω microstrip circuit is being used away from the ferroelectric material. After impedance matching, the RF signal travels through ferroelectric element 12 between conductor line 14 and ground plane 16. The length of ferroelectric element 12 is determined by the amount of phase shift required and the phase shift generated per unit length characteristic of the material.

While the RF signal travels in ferroelectric element 12, the dielectric properties of ferroelectric element 12 affect its propagation speed. However, the dielectric constant of ferroelectric element 12 is variable as a function of a DC voltage $V_{BIAS}$ applied to ferroelectric element 12 across conductor line 14 and ground plane 16. The DC voltage $V_{BIAS}$ changes the dielectric constant of ferroelectric element 12, which in turn causes a phase shift by altering the speed of the RF signal propagating in ferroelectric element 12. Thus, the amount of phase shift generated by phase shifter 10 is controlled by $V_{BIAS}$. According to the invention, $V_{BIAS}$ is a variable DC voltage supplied by an external DC power supply (not shown).

Referring further to FIG. 1, microwave energy is prevented from entering the DC supply by a high impedance, $\lambda/4$ shunt lowpass filter 22. In an alternative embodiment, an inductive coil is used to block the microwave energy.

Figure 2:
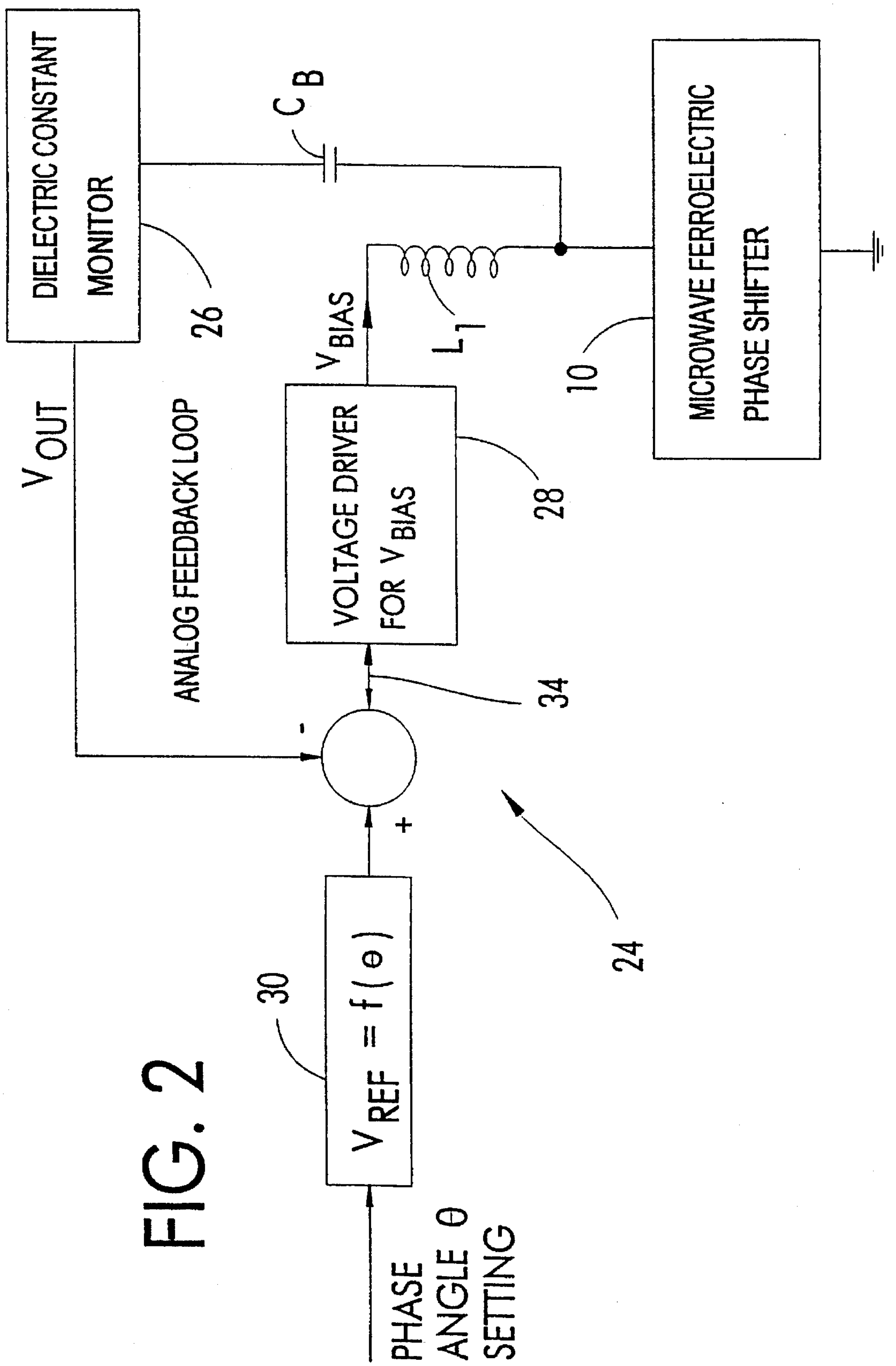
FIG. 2 is a block diagram of a controller circuit for the phase shifter of FIG. 1 according to the invention.
Figure 4:
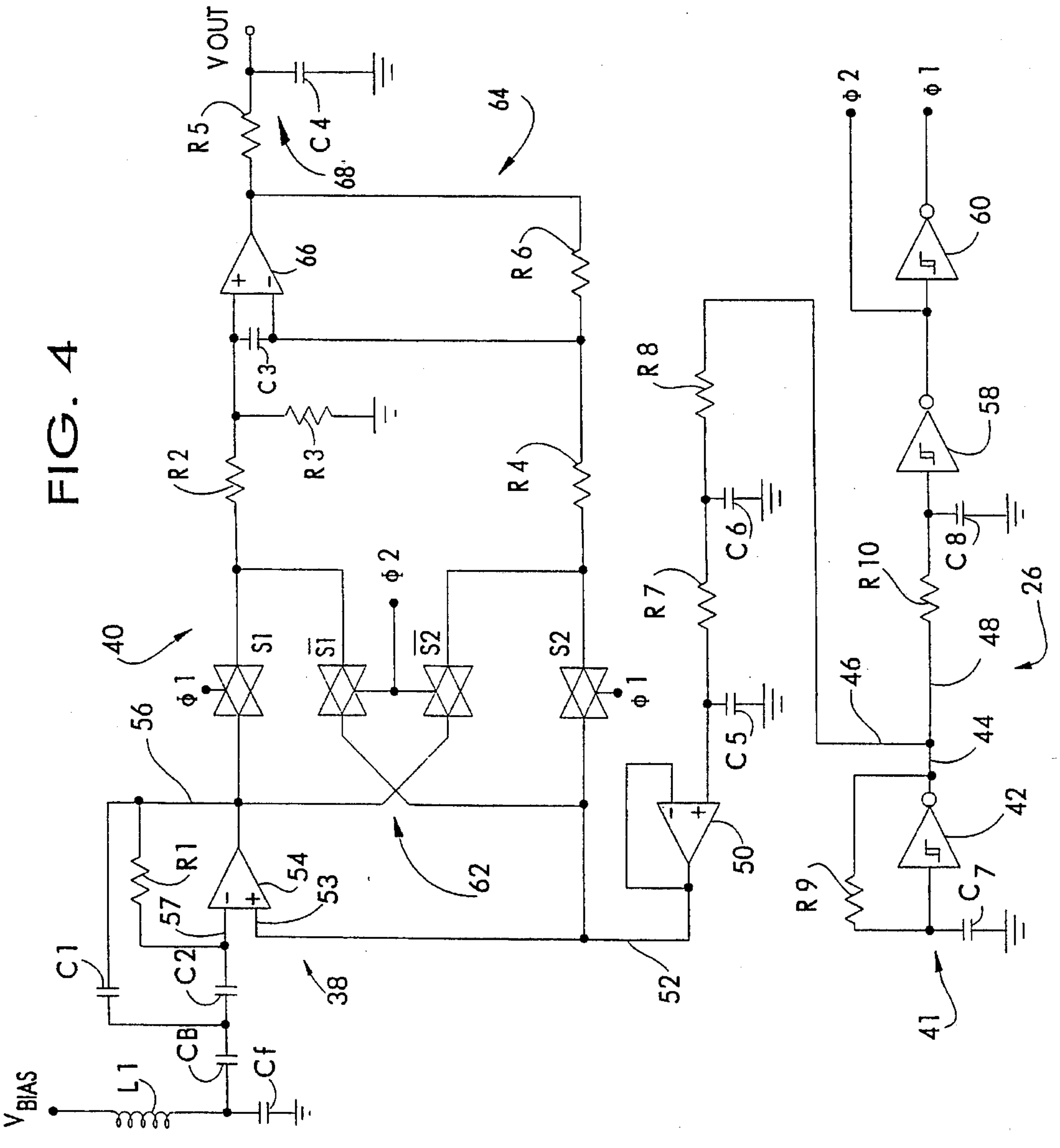
FIG. 4 is a schematic diagram of the dielectric constant monitor of FIG. 3 according to the invention.

FIG. 2 shows a controller circuit 24 for use with ferroelectric phase shifter 10 and including a dielectric constant monitor circuit 26 (shown in more detail in FIG. 4). According to the invention, the controller circuit 24 adjusts the voltage $V_{BIAS}$ to change the dielectric constant of ferroelectric element 12. The monitor circuit 26 detects this change as well as changes caused by temperature, humidity, aging, hysteresis and the like. In this manner, controller circuit 24 effects real-time calibration of phase shifter 10. According to the invention, monitor circuit 26 is separated from phase shifter 10 by a DC block $C_B$ which blocks the DC voltage $V_{BIAS}$ used to bias phase shifter 10 yet passes a monitor frequency fT to ferroelectric element 12. The monitor frequency $f_T$ will be described in detail below. In an analogous manner, an inductive coil $L_1$ substantially prevents alternating current energy at frequency $f_T$ from entering the DC voltage source from dielectric constant monitor circuit 26.

In one preferred embodiment, dielectric constant monitor circuit 26 is used in a negative feedback arrangement with a voltage bias driver 28 and a voltage reference signal generator 30 supplied, for example, by an external system. In this embodiment, the voltage bias driver 28 provides the bias voltage $V_{BIAS}$ and the voltage reference signal generator 30 provides a voltage reference $V_{REF}$ representative of the desired phase.

Monitor circuit 26 detects deviations in the dielectric constant due to temperature, aging, humidity, hysteresis and the like and outputs a signal $V_{OUT}$ at line 32. The signal $V_{OUT}$ is proportionally representative of the low frequency dielectric constant of ferroelectric element 12. Controller circuit 24 provides a control signal via line 34 as a function of $V_{OUT}$ which is used to vary $V_{BIAS}$ as a function of the detected changes. As a result, voltage bias driver 28 adjusts $V_{BIAS}$ to bring the output of monitor circuit 26, i.e., $V_{OUT}$, equal to the reference $V_{REF}$ provided by voltage reference signal generator 30. In this manner, controller circuit 24 varies the dielectric constant of ferroelectric element 12 thereby to compensate for changes in the dielectric constant of ferroelectric element 12 over time and to maintain the phase shift substantially constant at a selected, desired value.

In one preferred embodiment of the present invention, ferroelectric phase shifter 10, dielectric constant monitor circuit 26 and voltage bias driver 28 are hardware components while the remainder of the block diagram of FIG. 2 is encoded into a microcontroller (not shown) to complete the feedback loop.

Figure 3:
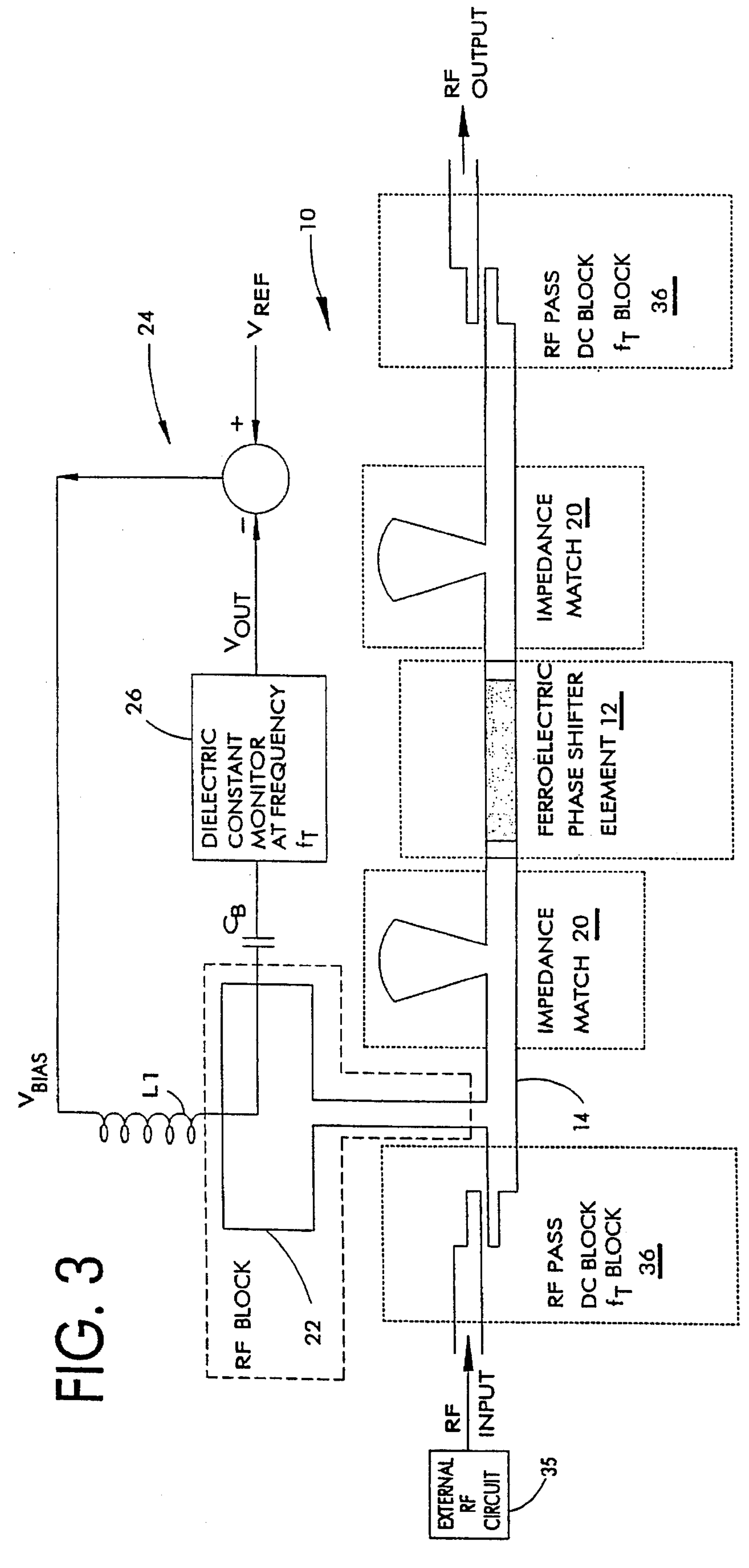
FIG. 3 illustrates the phase shifter of FIG. 1, partially in schematic and partially in block diagram form, and includes a dielectric constant monitor according to the invention.

With respect to FIG. 3, ferroelectric phase shifter 10 is shown with dielectric constant monitor circuit 26 for performing real-time calibration of phase shifter 10. In addition to the elements of phase shifter 10 shown in FIG. 1, FIG. 3 further shows a pair of blocking circuits 36 in the form of $\lambda/4$ coupled lines. As shown in FIG. 3, an external RF circuit 35 provides the RF input to phase shifter 10. Each blocking circuit 36 blocks both the DC voltage and the monitor frequency $f_T$ from passing through external connecting circuits at the RF input and RF output of phase shifter 10. In the alternative, a capacitive high-voltage DC blocking circuit located on the bottom surface of ground plane 16 of phase shifter 10 could be used. In a similar manner, the lowpass filter 22 blocks RF energy from leaking into either controller circuit 24 or the DC supply even while controller circuit 24 is able to measurably induce a current in ferroelectric element 12 for calibration purposes. Also, the inductive coil $L_1$ blocks energy at the monitor frequency fT from entering the DC supply yet passes DC voltage while the capacitor $C_B$ blocks DC voltage from entering monitor circuit 26 yet passes energy at the monitor frequency $f_T$.

FIG. 4 is a schematic diagram of dielectric constant monitor circuit 26. As stated above, monitor circuit 26 generates an output signal $V_{OUT}$ representative of the dielectric constant of ferroelectric element 12 and, thus, representative of any changes in the dielectric constant occurring over time. In general, monitor circuit 26 is comprised of a sine wave voltage injector circuit 38 and a synchronous detector circuit 40. The voltage injector circuit 38 injects a sine wave reference signal at the monitor frequency $f_T$ through ferroelectric element 12. In turn, the synchronous detector circuit 40 detects the dielectric constant of ferroelectric element at the relatively low frequency $f_T$. In one preferred embodiment, $f_T$ is approximately 10 kHz, voltage injector circuit 38 constitutes a reference generator and synchronous detector 40 constitutes a current detector.

Referring further to FIG. 4, an oscillator 41, comprised of a Schmitt trigger inverter 42, a capacitor C7 and a resistor R9, generates a square wave reference signal at line 44. The square wave signal is split into a first branch 46 and a second branch 48. The first branch 46 includes resistors R8 and R7 and capacitors C6 and C5 connected to an operational amplifier follower circuit 50. In a preferred embodiment, the circuit components of first branch 46 perform amplitude reduction and wave shaping resulting in a predominantly sine wave shaped signal at line 52. The sine wave reference signal is input to the sine wave injector circuit 38 at an input 53 of an operational amplifier stage 54. Sine wave injector circuit 38 applies the sine wave reference signal to ferroelectric element 12 of phase shifter 10 via feedback loop 56. In FIG. 4, the effective capacitance of phase shifter 10 is represented by $C_F$. Applying the sine wave reference signal to ferroelectric element 12 induces a current therein. In turn, a detected voltage signal proportionally representative of the induced current is seen at an input 57 to the op amp 54. Synchronous detector 40 measures the resulting current induced in ferroelectric element 12 by the applied sine wave reference and then converts it into the output voltage signal $V_{OUT}$.

The second branch 48 includes a resistor-capacitor circuit R10 and C8 for momentarily delaying the square wave reference signal followed by a pair of Schmitt inverters 58 and 60 for generating a bi-phase clock signal from the delayed reference signal. Preferably, the two phases of the bi-phase clock signal are represented by ϕ1 and ϕ2 wherein ϕ2 is of the opposite polarity as ϕ1. Each phase, however, has the same duty cycle as the square wave reference signal.

According to the invention, the bi-phase clock signal drives synchronous detector 40. The short time delay associated with R10 and C8 balances the delays incurred along the square wave reference signal's first branch 46 to provide proper phase alignment between synchronous detector 40 and the sine wave signal to be detected. In a preferred embodiment, the oscillator 41 in combination with branch 48 of the circuitry of FIG. 4 constitutes a clock circuit for synchronizing synchronous detector 40 to the reference voltage at frequency $f_T$.

Referring further to FIG. 4, synchronous detector 40 preferably includes a crossbar switching network 62 responsive to the bi-phase clock signal followed by a differential amplifier circuit 64 for multiplying the voltage corresponding to the current induced in ferroelectric element 12 with the square wave reference signal. During one half of the square wave cycle, switches $S_1$ and $S_2$ are closed (and corresponding inverse switches $/S_1$ and $/S_2$ are open). During second half of square wave, the switching reverses. Switches $S_1$, $S_2$, $/S_1$, $/S_2$ are preferably electronic analog switches. The differential amplifier circuit 64 is preferably comprised of an operational amplifier 66 associated with resistors R2, R3, R4 and R6 and a capacitor C3. As shown in FIG. 4, a low pass filter 68, comprised of a resistor R5 and a capacitor C4, follows differential amplifier circuit 64 to filter its output. In this manner, synchronous detector 40 functions as a full wave rectifier only at the synchronous frequency $f_T$. Thus, only the current induced in $C_F$ by the test signal injected by sine wave voltage injector 38 is represented by the output $V_{OUT}$ from dielectric constant monitor circuit 26. Since controller circuit 24 provides the control signal to voltage driver 28 to vary the applied DC voltage $V_{BIAS}$ as a function of $V_{OUT}$, changes in the dielectric constant of ferroelectric element 12 over time are compensated for and the phase shift of phase shifter 10 is maintained substantially constant.

It is understood by those skilled in the art that the present invention is also applicable to calibrate inverted microstrip circuit phase shifters, slotline circuit phase shifters, coplanar phase shifters and their derivatives as well as microstrip circuit phase shifters as disclosed herein.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A ferroelectric phase shifter for shifting the phase of a radio frequency (RF) signal comprising:

a conductor line;

a ground plane;

a ferroelectric element between the conductor line and the ground plane to form a microstrip circuit through which the RF signal propagates, said ferroelectric element having a dielectric constant that can be varied as a function of a DC voltage applied to the ferroelectric element wherein the speed of the RF signal propagating through the ferroelectric element is a function of the dielectric constant;

a DC voltage source connected across the conductor line and the ground plane for applying a variable DC voltage to the ferroelectric element in response to a control signal thereby to vary the dielectric constant of the ferroelectric element; and a controller circuit for detecting changes in the dielectric constant of the ferroelectric element and providing the control signal to the DC voltage source to vary the applied DC voltage as a function of the detected changes whereby changes in the dielectric constant over time are compensated for and the phase shift is maintained substantially constant.

2. The phase shifter of claim 1 wherein the controller circuit includes a reference generator for applying a reference signal to the ferroelectric element at a frequency fT, said controller circuit inducing a current in the ferroelectric element as a function of the reference signal and independent of the applied DC voltage and the RF signal.

3. The phase shifter of claim 2 wherein the controller circuit includes a current detector for detecting the current induced in the ferroelectric element by the reference signal, said current detector providing a detected signal representative of the detected induced current.

4. The phase shifter of claim 3 wherein the current detector comprises a synchronous detector for comparing the reference signal to the detected signal, said synchronous detector providing an output signal representative of the dielectric constant of the ferroelectric element, said controller circuit providing the control signal to the DC voltage source to vary the applied DC voltage as a function of the output signal.

5. The phase shifter of claim 3 further comprising a clock circuit for synchronizing the current detector to the reference signal at the frequency $f_T$.

6. The phase shifter of claim 2 further comprising a first DC blocking circuit for isolating the controller circuit from the applied DC voltage whereby the current induced in the ferroelectric element by the reference signal is independent of the applied DC voltage.

7. The phase shifter of claim 6 wherein the RF signal is provided by an external RF circuit and further comprising a second DC blocking circuit for isolating the RF signal propagating in the microstrip from the applied DC voltage whereby the RF signal in the external RF circuit is not DC shifted.

8. The phase shifter of claim 2 further comprising a high impedance, low pass filter functionally interposed between the DC voltage source and the conductor line for isolating the DC voltage source and the controller circuit from the RF signal whereby the RF signal is prevented from entering the DC voltage source and the controller circuit when the controller circuit is inducing current in the ferroelectric element thereby to calibrate the phase shifter.

9. A method of controlling a ferroelectric phase shifter, said phase shifter having a ferroelectric element, a conductor line and a ground plane, said ferroelectric element being between the conductor line and the ground plane to form a microstrip circuit through which a radio frequency (RF) signal propagates for phase shifting, said ferroelectric element having a dielectric constant that can be varied as a function of a DC voltage applied to the ferroelectric element wherein the speed of the RF signal propagating through the ferroelectric element is a function of the dielectric constant, said method comprising:

applying a variable DC voltage to the ferroelectric element by connecting a DC voltage source across the conductor line and the ground plane;

detecting changes in the dielectric constant of the ferroelectric element;

providing a control signal to the DC voltage source as a function of the detected changes; and varying the applied voltage of the DC voltage source in response to the control signal thereby to vary the dielectric constant of the ferroelectric element whereby changes in the dielectric constant over time are compensated for and the phase shift is maintained substantially constant.

10. The method of claim 9 wherein the step of detecting changes in the dielectric constant of the ferroelectric element includes the step of applying a reference signal to the ferroelectric element at a frequency $f_T$, said reference voltage signal inducing a current in the ferroelectric element independent of the applied DC voltage and the RF signal.

11. The method of claim 10 wherein the step of detecting changes in the dielectric constant of the ferroelectric element includes the steps of detecting the current induced in the ferroelectric element by the reference signal and providing a detected signal representative of the detected induced current.

12. The method of claim 11 further comprising the steps of comparing the reference signal to the detected signal and providing an output signal representative of the dielectric constant of the ferroelectric element, said step of providing a control signal to the DC voltage source as a function of the detected changes providing the control signal to the DC voltage source to vary the applied DC voltage as a function of the output signal.

13. The method of claim 11 further comprising the step of synchronizing the step of detecting the induced current to the reference signal at the frequency $f_T$.

14. The method of claim 10 wherein the control signal is provided by a controller circuit and further comprising the step of isolating the controller circuit from the applied DC voltage whereby the current induced in the ferroelectric element by the reference signal is independent of the applied DC voltage.

15. The method of claim 14 further comprising the step of isolating the DC voltage source and the controller circuit from the RF signal whereby the RF signal is prevented from entering the DC voltage source and the controller circuit when current is induced in the ferroelectric element thereby to calibrate the phase shifter.

16. A real-time calibrator for a ferroelectric phase shifter, said phase shifter having a ferroelectric element, a conductor line and a ground plane, said ferroelectric element being between the conductor line and the ground plane to form a microstrip circuit through which a radio frequency (RF) signal propagates for phase shifting, said ferroelectric element having a dielectric constant that can be varied as a function of a DC voltage applied to the ferroelectric element wherein the speed of the RF signal propagating through the ferroelectric element is a function of the dielectric constant, said calibrator comprising:

a DC voltage source connected across the conductor line and the ground plane for applying a variable DC voltage to the ferroelectric element in response to a control signal thereby to vary the dielectric constant of the ferroelectric element; and a controller circuit for detecting changes in the dielectric constant of the ferroelectric element and providing the control signal to the DC voltage source to vary the applied DC voltage as a function of the detected changes whereby changes in the dielectric constant over time are compensated for and the phase shift is maintained substantially constant.

* * * * *